United States Patent [19]

Knight et al.

[11] Patent Number: 4,859,628

[45] Date of Patent: Aug. 22, 1989

[54] INTERRUPTED LIQUID PHASE EPITAXY PROCESS

[75] Inventors: Douglas G. Knight, Munster; William Benyon, Nepean, both of Canada

[73] Assignee: Northern Telecom Limited, Montreal, Canada

[21] Appl. No.: 179,834

[22] Filed: Apr. 11, 1988

[51] Int. Cl.$^4$ .............. H01L 21/208; H01R 21/20
[52] U.S. Cl. .............. 437/133; 437/129; 437/130; 437/119; 156/DIG. 89; 156/622; 148/DIG. 66; 148/DIG. 101; 357/16; 357/17; 372/43; 372/48; 372/102
[58] Field of Search .............. 156/622, DIG. 89; 437/129, 119, 130, 133; 148/DIG. 101, DIG. 66; 357/17, 16; 372/43, 48, 102

[56] References Cited

U.S. PATENT DOCUMENTS

| | | | |
|---|---|---|---|
| 4,072,544 | 2/1978 | DeWinter et al. | 437/133 |
| 4,073,676 | 2/1978 | Aiki et al. | 437/133 |
| 4,075,043 | 2/1978 | Clarke et al. | 156/622 |
| 4,482,423 | 11/1984 | Besomi et al. | 156/DIG. 89 |
| 4,561,915 | 12/1985 | Mito | 437/133 |
| 4,601,888 | 7/1986 | Besomi et al. | 156/DIG. 89 |
| 4,729,963 | 3/1988 | Tabatabaie | 437/133 |
| 4,798,812 | 1/1989 | Wilson | 437/130 |
| 4,805,178 | 2/1989 | Wilt | 372/46 |

FOREIGN PATENT DOCUMENTS

| | | | |
|---|---|---|---|
| 2338316 | 2/1975 | Fed. Rep. of Germany | 437/130 |
| 0027362 | 3/1978 | Japan | 437/130 |
| 0154269 | 12/1979 | Japan | 156/622 |
| 0094678 | 7/1981 | Japan | 437/130 |

OTHER PUBLICATIONS

Nagai et al., "Prevention of Surface Corrugation Thermal Deformation for InGaAsP/InP DFB Lasers", Ja. J. Appl. Phys., vol. 22, No. 5, May 1983, pp. L291-L293.
Kinoshita et al., "Preserving InP Surface Corrugations for 1.3 μm GaInAsP/InP DFB Lasers From Thermal Deformation During LPE Process," Electronics Letters, vol. 19, No. 6, 17th Mar. 1983, pp. 215-216.
Digiuseppe et al., "Large Area LPE Growth of InGaAsP/InP Double Heterostructures on InP Preserved in a Phosphorus Ambient", J. Cryst. Growth, vol. 58, No. 1, 1982, pp. 279-284.
Antypas, "Prevention of InP Surface Decomposition in Liquid Phase Epitaxial Growth", Appl. Phys. Letts., vol. 37, No. 1, Jul. 1, 1980, pp. 64-65.
Ohtsuka et al., "LPE Growth of InP/InGaAsP/InGaAs/InP Heterostructure at Normal Cooling Rate at 630° C.", J. Cryst. Growth, vol. 87, 1988, pp. 338-342.

Primary Examiner—Brian E. Hearn
Assistant Examiner—M. Wilczewski
Attorney, Agent, or Firm—Philip W. Jones

[57] ABSTRACT

An interrupted liquid phase epitaxy process for producing distributed feedback laser wafers involves epitaxial growth at a first temperature range followed by epitaxial growth at a second higher temperature range. A prior art liquid phase epitaxy process involves a low temperature soak at a temperature of approximately 615 degrees Centigrade followed by ramped cooling and epitaxial growth of a guiding layer, active layer and confining layer at a temperature of approximately 595 degrees Centigrade. The interrupted liquid phase epitaxy process involves epitaxial growth of a guiding layer in a manner similar to the prior art process, but growth of the guiding layer is followed by a high temperature soak at a temperature of approximately 645 degrees Centigrade. Ramped cooling follows, with epitaxial growth of the active layer and confining layer taking place at a temperature of approximately 628 degrees Centigrade. Epitaxial growth at the higher temperature reduces difficulties with spinodal decomposition and allows improved control over the amount of phosphorus used in the process.

12 Claims, 2 Drawing Sheets

INTERRUPTED LIQUID PHASE EPITAXY PROCESS

This invention relates to a liquid phase epitaxy process, and more particularly, to an interrupted liquid phase epitaxy process that involves epitaxial growth at a first temperature range followed by epitaxial growth at a second higher temperature range.

Distributed feedback (DFB) lasers emitting at $\lambda = 1.3\mu m$. or $\lambda = 1.55\mu m$. using the InGaAsP/InP alloy system are one of the major potential light sources for long-haul high-capacity optical communication systems. Such DFB lasers are produced by growing epitaxial layers (epilayers) upon gratings etched either directly into the InP wafer substrate or into a previously-grown epitaxial layer on that substrate. These gratings have periods of approximately 3850Å for a $\lambda = 1.3\mu m$. second-order DFB laser, and are typically 1500Å in depth. To ensure that such gratings are not thermally decomposed prior to crystal growth, production of such wafers using the liquid phase epitaxy (LPE) technique has required that epitaxial growth temperatures be maintained at or below 590° C. to 600° C. However, epitaxial growth at that range of temperatures presents difficulties for production of either the InGaAsP $\lambda = 1.3\mu m$. or $\lambda = 1.55\mu m$. active layers. For $\lambda = 1.3\mu m$. material, spinodal decomposition occurs in the 600° C. to 650° C. range, with the tendency to decompose increasing as the growth temperature is lowered. This results in a very small allowable growth temperature range for this material. For $\lambda = 1.55\mu m$. material, the phosphorus mole fraction in the growth melt is only $2.2 \times 10^{-4}$ for a lattice-matched layer with a liquidus temperature of 590° C., making the accurate control of the amount of phosphorus added a potentially difficult problem.

A technique has been developed for producing DFB laser wafers which allows the use of higher epitaxial growth temperatures while maintaining the integrity of the gratings. The technique involves a continuous process which allows epitaxial growth of a protective guiding layer over the substrate gratings at a first temperature, followed by epitaxial growth of an active layer and a confining layer at a second higher temperature.

The interrupted liquid phase epitaxy process of the invention comprises the initial step of maintaining an As overpressure above a first surface of an InP substrate while the temperature of that substrate and a first melt material is raised to a first temperature. That temperature is held for a time sufficient to transform the first melt material to a liquid state. The temperature of the InP substrate and the first melt material is then lowered to a second temperature. The first surface of the InP substrate is exposed to the first melt material at the second temperature, and a guiding epilayer is thereby created on the first surface; that exposure is then terminated. Then, a P overpressure is maintained above the guiding epilayer while the temperature of the InP substrate and second and third melt materials are raised to a third temperature approximately 30 degrees higher than the first temperature. The second and third melt materials are maintained at the third temperature for a time sufficient to transform the second and third melt materials to a liquid state. The temperature of the InP substrate and the second and third melt materials are then lowered to a fourth temperature. The guiding epilayer is then exposed to the second melt material at the fourth temperature, and an active epilayer is thereby created on the guiding epilayer; that exposure is then terminated. The active epilayer is then immediately exposed to the third melt material, and a confining epilayer is thereby created on the active epilayer; the final step involves the termination of that exposure. With respect to this process, the first melt material may be n-doped InGaAsP with an InGaAsP guiding epilayer being formed, the second melt material may be n-doped InGaAsP with a InGaAsP active epilayer being formed, and the third melt material may be p-doped InP with an InP confining epilayer being formed.

A further form of the interrupted liquid phase epitaxy process of the invention comprises additional epitaxial steps. In this further form, the InP substrate and the second and third melt materials are maintained at the third temperature for a time sufficient to also transform a fourth melt material to a liquid state. The additional steps occur immediately after the step of terminating the exposure of the InGaAsP active epilayer to the third melt material. The first additional step involves exposing the confining epilayer to the fourth melt material to create a capping epilayer on the confining epilayer, and the other additional step involves terminating that exposure. The fourth melt material may be n-doped InGaAs with an InGaAs capping epilayer being formed.

The As overpressure may be provided by placing a slice of GaAs material adjacent to the first surface of the InP substrate. The P overpressure may be provided by suspending an InP:Sn mixture above the InGaAsP guiding epilayer on the InP substrate.

The subject process will next be described in terms of a preferred embodiment utilizing the accompanying drawings, in which.

Figure 1:
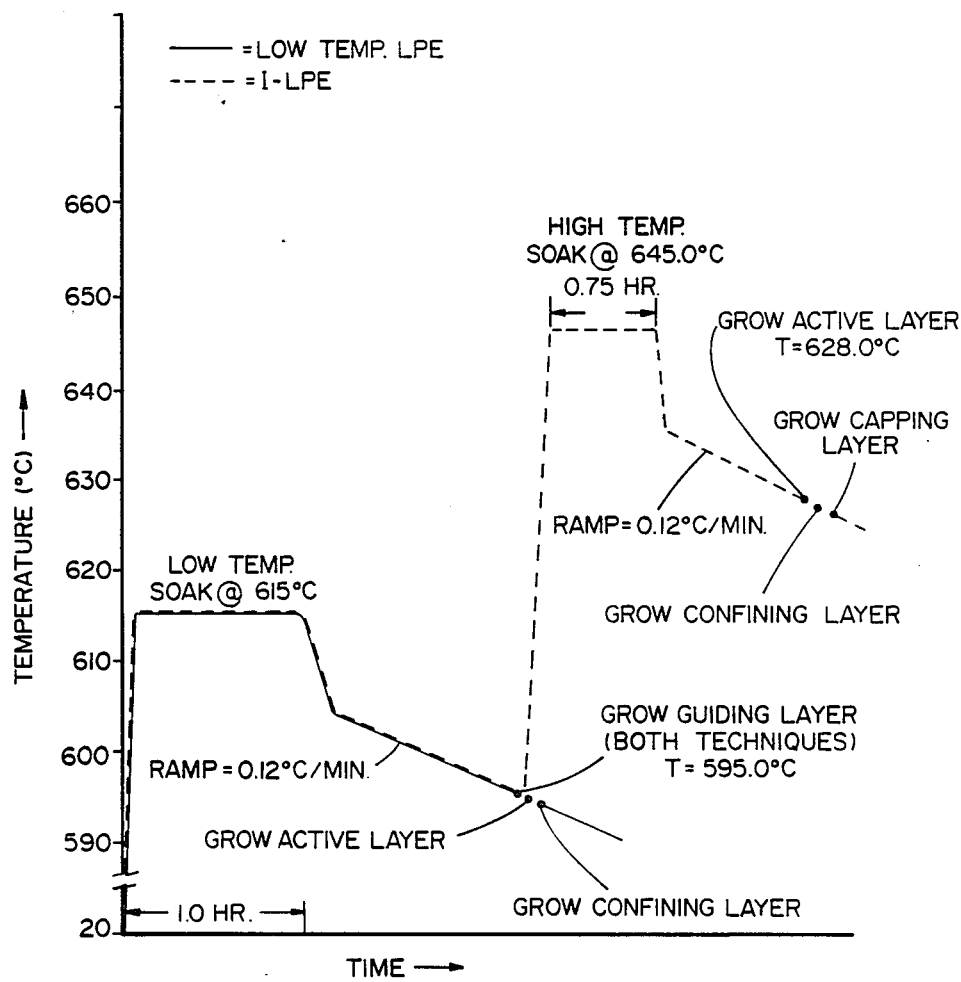
FIG. 1 illustrates the temperature program utilized to create a laser wafer according to the process of the invention, as well as the temperature program utilized in the low-temperature prior art process.

A comparison is shown in FIG. 1 between the temperature program utilized to create laser wafers in a prior art LPE process and the program utilized by the preferred form of the process of this invention, which will be referred to as the interrupted LPE process or I-LPE process.

Figure 3:
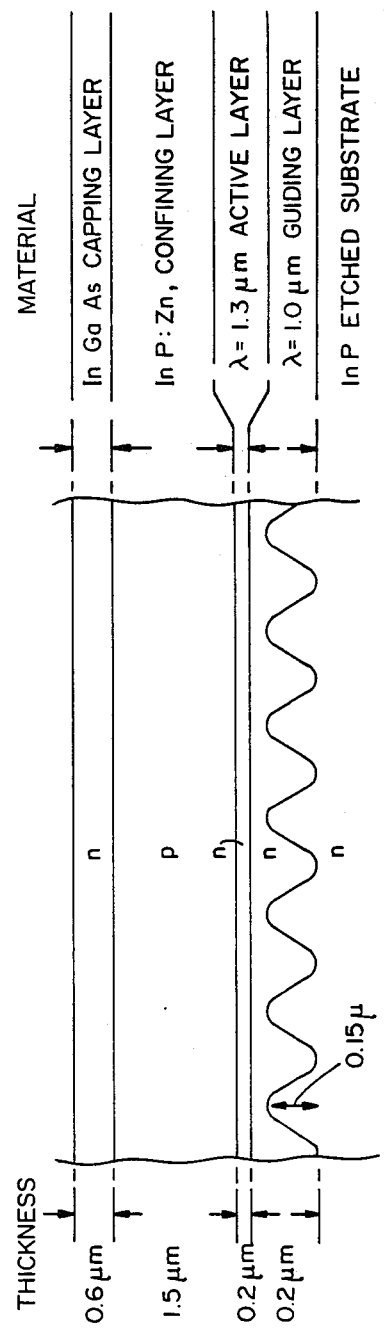
FIG. 3 is a cross-sectional schematic view of the substrate and epilayers produced by the process of the invention.

Both the prior art LPE process and the I-LPE process involve the same initial steps, namely, heating of an InP wafer and a $\lambda = 1.0\mu m$. Sn-doped InGaAsP melt material to approximately 615° C., holding the wafer and a $\lambda = 1.0\mu m$. Sn-doped InGaAsP melt material at that temperature for approximately one hour to melt all of the melt material, cooling the wafer and melt material quickly to 605° C. and then at a controlled slower rate (0.12° C./min.) to 595° C., and then exposing a surface of the wafer to the melt material at 595° C. to form a $\lambda = 1.0\mu m$. guiding epilayer on the wafer surface. The guiding epilayer is formed on a surface of the InP wafer on which a series of parallel gratings have previously been formed; a cross-section of those gratings can be seen in FIG. 3. The gratings, which have a period of approximately 3850Å and an average depth of approximately 1500Å, are formed by holographic exposure and reactive ion etching processing techniques;

they are used to narrow the frequency spectrum of the light produced by the laser. As illustrated by FIG. 3, the guiding epilayer fills the troughs of the gratings and extends above the crests of the gratings, the epilayer having a maximum thickness of approximately 2000Å.

After formation of the $\lambda=1.0\mu m$. guiding epilayer, the prior art LPE process involves a continuation of the cooling of the wafer at the controlled rate. Typically, a $\lambda=1.3\mu m$. active epilayer is grown approximately 2000Å thick from a Sn-doped InGaAsP melt material, followed by the growth of a confining epilayer approximately 1.5$\mu m$. thick from a Zn-doped InP melt material. Continuation of the 0.12° C./min. cooling results in the active epilayer of the prior art LPE process being formed at 594.6° C., and the confining epilayer being formed at 594.4° C. Data for this typical prior art LPE process are contained in Table I, in which $\Delta a/a$ refers to the difference in the lattice constant between the particular epilayer and the wafer substrate on which the particular epilayer is formed.

Figure 2:
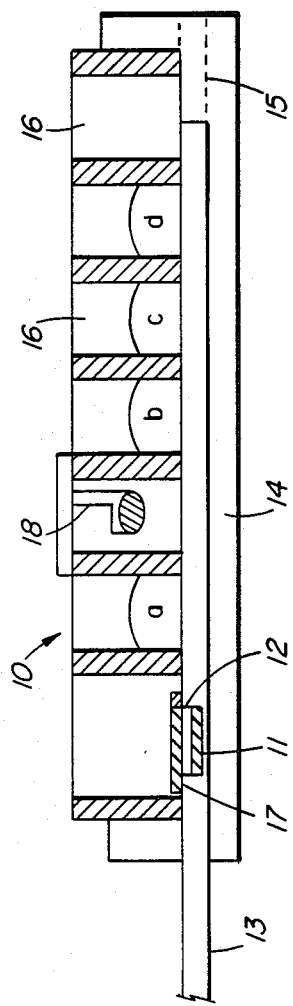
FIG. 2 is a schematic view of a carbon boat assembly utilized to create a laser wafer according to the process of the invention.

The I-LPE process employs a horizontal LPE furnace with a Pd-purified $H_2$ ambient. The graphite boat assembly generally designate 10 in FIG. 2 is inserted into the furnace after an InP wafer 11 has been mounted into an indentation 12 on a slide member 13. Slide member 13 is slidably mounted in a groove 15 of the base 14 of boat assembly 10 such that indentation 12 may form a portion of the floor of any one of the seven bins 16 shown in FIG. 2. Boat assembly 10, including slide member 13, is placed into the horizontal LPE furnace during the I-LPE temperature program to be discussed. An InP wafer sitting in indentation 12 and melt materials contained in one or more of the bins 16 undergo the same temperature program within the LPE furnace. A typical prior art LPE process would utilize a similar mechanical arrangement.

The I-LPE process is commenced by placing InP wafer 11 into the indentation 12 on slide member 13 such that the parallel gratings on wafer 11 face upwardly. Slide member 13 is then pushed into groove 15 of boat assembly base 14 until wafer 11 forms a part of the floor of the leftmost one of the seven bins 16 shown in FIG. 2. A GaAs cover slice 17 is placed across the bottom of that bin such that the lower surface of slice 17 sits adjacent to the upper surface of wafer 11. Indentation 12 is a precisely machined slot, and the gap between the surfaces of slice 17 and wafer 11 is extremely small. The purpose of GaAs cover slice 17 is to create an As overpressure, i.e. an As-intensive atmosphere, on the surface of wafer 11 during that portion of the temperature program when the wafer is held at 615° C. for approximately 1 hour. The As overpressure prevents significant thermal deformation of the gratings on wafer 11.

Prior to boat assembly 10 being placed into the LPE furnace, five of the other six bins 16 are loaded as shown in FIG. 2. The second bin, ie. the one next to the bin housing GaAs cover slice 17, is loaded with a Sn-doped InGaAsP $\lambda=1.0\mu m$. melt material which is used in forming a $\lambda=1.0\mu m$. InGaAsP guiding epilayer on the wafer. A quartz basket 18 filled with an InP:Sn mixture is secured to the top of the third bin, a portion of basket 18 sealing off the top of the bin. The InP:Sn mixture is suspended in basket 18 at a central position within the bin. The fourth bin is loaded with a Sn-doped InGaAsP $\lambda=1.3\mu m$. melt material which is used in forming a $\lambda=1.3\mu m$. InGaAsP active epilayer on the InGaAsP guiding epilayer. The fifth bin is loaded with a Zn-doped InP melt material which is used in forming an InP confining epilayer on the InGaAsP active epilayer. The sixth bin is loaded with a Sn-doped InGaAs melt material which is used in forming an InGaAs capping epilayer on the InP confining epilayer. Formation of a capping epilayer is not an essential part of the I-LPE process; the capping layer on the wafer may instead be grown by another crystal growth process such as metal organic chemical vapour deposition (MOCVD). The last bin, ie. the rightmost bin shown in FIG. 2, is left empty during the process; wafer 11 is positioned in the base of this bin while cooling during the final stage of the temperature program.

After the formation of the $\lambda=1.0\mu m$. InGaAsP guiding epilayer on wafer 11 in the I-LPE process, slide member 13 is actuated by a connected programmed mechanical drive to move wafer 11 into the bin containing basket 18. The InP:Sn mixture in basket 18 is used to create a P overpressure over the surface of the InGaAsP epilayer while the furnace temperature is ramped quickly to 645.0° C. and held at that temperature for 45 minutes. An overpressure of P has recently been shown to preserve an InP substrate and epilayers from thermal degradation at temperatures in the 645° C. range, and also to prevent deposition of In-rich droplets from InP growth melts. The InP:Sn mixture in basket 18 contains 8.1 atomic percent InP in Sn. There is no direct line-of-sight between the epilayer and the InP:Sn mixture in basket 18, and no spattering is normally produced to create defects in the guiding epilayer on wafer 11. A layer of Sn up to 10Å thick may be deposited on the guiding epilayer by the InP:Sn mixture during the 45 minutes that wafer 11 remains under basket 18, but such Sn layer is dissolved in the subsequent LPE melt materials to be discussed and does not create any problems with wafers grown according to the I-LPE process.

After wafer 18 has been held in the P-intensive atmosphere for 45 minutes at 645.0° C., the temperature in the furnace is quickly dropped such that the temperature of wafer 11 and the melt materials in the furnace are cooled from 645.0° C. to 635.0° C., after which the temperature is decreased at a more gradual rate of 0.12° C./min. At a temperature of 628.0° C., slide member 13 is actuated to move wafer 11 into contact with the Sn-doped GaInAsP $\lambda=1.3\mu m$. melt material in the adjacent bin. Epitaxial growth of the $\lambda=1.3\mu m$. active epilayer occurs at 628.0° C and is allowed to proceed for 8.0 seconds, the active epilayer forming to a depth of approximately 0.15$\mu m$. during that time. Slide member 13 is then actuated automatically to move wafer 11 into the base of the next bin which contains the Zn-doped InP melt material. Wafer 11 is kept at the base of that bin for approximately 3.0 minutes during which time a confining InP epilayer approximately 1.5$\mu m$. thick is formed over the active epilayer. Movement of P from the InP:Sn mixture suspended in basket 18 to the InGaAsP melt material used in forming the guiding epilayer may result in variations in the thickness of the guiding epilayer; this problem can be corrected by producing a more tightly-sealed basket 18.

Slide member 13 is then again actuated to move wafer 11 into the base of the next bin which contains the Sn-doped InGaAs melt material, and is kept at the base of that bin for 5.0 seconds. By this time the temperature of the furnace interior and the furnace contents have cooled at the 0.12° C./min. rate to approximately 627.7° C. The resulting Sn-doped $In_{0.53}Ga_{0.47}As$ capping;

layer has a depth of approximately 0.6μm. The supercooling of the melt materials in the I-LPE process is approximately 6° C., which ensures that all of the melt material is dissolved during the soaking period of 45 minutes at 645.0° C. A final actuation of slide member 13 results in wafer 11 entering the base of the final bin, which is empty. The formation of the capping epilayer is an optional step, and the process may involve the movement of wafer 11 directly into the empty bin after the growth of the InP confining epilayer. Wafer 11 is kept in the empty bin while the wafer temperature is quickly reduced to room temperature. Table II consolidates the data for typical epilayers for the I-LPE process.

Broad area stripe lasers were produced from wafers grown using the I-LPE process. The lasers exhibited single-mode distributed feedback action without using anti-reflection coating on the facets, and were linear to approximately 5 mW. A sample burn-in test at 96° C. and 100 mA. current for 36 hours showed no significant difference in performance between wafers grown using the prior art LPE process and wafers grown using the I-LPE process. However, as previously mentioned, the I-LPE process allows better control over variables difficult to control with the prior art process.

TABLE I

| | guiding layer | active layer | confining layer |
|---|---|---|---|
| mg InP/g In | 4.46 | 1.10 | 5.39 |
| mg GaAs/g In | 1.46 | 10.08 | — |
| mg InAs/g In | 17.13 | 44.62 | — |
| mg dopant/g In | Sn = 3.0 | Sn = 2.0 | Zn = 0.25 |
| $\lambda_{PL}$ (μm) | 1.008–1.028 | 1.300–1.335 | — |
| Δa/a | 0.02% | 0.02% | — |
| doping (cm$^{-3}$) | $7 \times 10^{17}$(n) | $5 \times 10^{17}$(n) | $2 \times 10^{18}$(p) |
| T growth (°C.) | 595.0 | 594.6 | 594.4 |

TABLE II

| | guiding layer | active layer | confining layer | capping layer |
|---|---|---|---|---|
| mg InP/g In | 4.46 | 2.58 | 7.70 | — |
| mg GaAs/g In | 1.46 | 11.40 | — | 32.25 |
| mg InAs/g In | 17.13 | 64.40 | — | 53.15 |
| mg dopant/g In | Sn = 3.0 | Sn = 2.0 | Zn = 0.25 | Sn = 10.0 |
| $\lambda_{PL}$ (μm) | 1.008–1.028 | 1.300 | — | 1.66 |
| Δa/a | 0.02% | 0.02% | — | 0.02% |
| doping (cm$^{-3}$) | $7 \times 10^{17}$ (n) | $5 \times 10^{17}$ (n) | 7–8 $\times 10^{17}$ (p) | $1 \times 10^{18}$ (n) |
| T growth (°C.) | 595.0 | 628.0 | 628.0 | 627.7 |
| growth time | 20 sec. | 8.0 sec. | 3.0 min. | 5.0 sec. |

We claim:

1. A liquid phase epitaxy process for growing epilayers over gratings on a first surface of an InP substrate, the substrate and epilayers together forming an InGaAsP/InP distributed feedback laser wafer, the process comprising the steps of:
   (a) maintaining an As overpressure above the first surface while raising the temperature of the InP substrate and a first melt material to a first temperature, the InP substrate and the first melt material being maintained at the first temperature for a time sufficient to transform the first melt material to a liquid state;
   (b) lowering the temperature of the InP substrate and first melt material to a second temperature;
   (c) exposing the first surface to the first melt material at the second temperature, a guiding epilayer being thereby created on the first surface;
   (d) terminating the exposure of the first surface to the first melt material;
   (e) maintaining a P overpressure above the guiding epilayer while raising the temperature of the InP substrate and second and third melt materials to a third temperature approximately 30 degrees higher than the first temperature, the InP substrate and the second and third melt materials being maintained at the third temperature for a time sufficient to transform the second and third melt materials to a liquid state;
   (f) lowering the temperature of the InP substrate and the second and third melt materials to a fourth temperature;
   (g) exposing the guiding epilayer to the second melt material at the fourth temperature, an active epilayer being thereby created on the guiding epilayer;
   (h) terminating the exposure of the guiding epilayer to the second melt material;
   (i) exposing the active epilayer immediately to the third melt material, a confining epilayer being thereby created on the active epilayer; and,
   (j) terminating the exposure of the active epilayer to the third melt material.

2. A liquid phase epitaxy process as in claim 1, wherein the first melt material is n-doped InGaAsP and an InGaAsP guiding epilayer is formed, wherein the second melt material is n-doped InGaAsP and an InGaAsP active epilayer is formed, and wherein the third melt material is p-doped InP and an InP confining epilayer is formed.

3. A liquid phase epitaxy process as in claim 1, wherein the InP substrate and the second and third melt materials are maintained at the third temperature for a time sufficient to also transform a fourth melt material to a liquid state, and wherein the process comprises the further steps, immediately after the step of terminating the exposure of the active epilayer to the third melt material, of:
   (a) exposing the confining epilayer to the fourth melt material, a capping epilayer being thereby created on the confining epilayer; and,
   (b) terminating the exposure of the confining epilayer to the fourth melt material.

4. A liquid phase epitaxy process as in claim 3, wherein the first melt material is n-doped InGaAsP and a InGaAsP guiding epilayer is formed, wherein the second melt material is n-doped InGaAsP and an active epilayer is formed, wherein the third melt material is p-doped InP and an InP confining epilayer is formed, and wherein the fourth melt material is n-doped InGaAs and an InGaAs capping epilayer is formed.

5. A liquid phase epitaxy process as in claim 2 or 4, wherein the As overpressure is provided by placing a slice of GaAs material adjacent to the first surface of the InP substrate.

6. A liquid phase epitaxy process as in claim 2 or 4, wherein the P overpressure is provided by suspending an InP:Sn mixture above the InGaAsP guiding epilayer on the InP substrate.

7. A liquid phase epitaxy process for growing epilayers over gratings on a first surface of an InP substrate, the substrate and epilayers together forming an In- GaAsP/InP distributed feedback laser wafer, the process comprising the steps of;
  (a) maintaining an As overpressure above the first surface for approximately one hour while raising the temperature of the InP substrate and a n-doped InGaAsP melt material to approximately 615 degrees Centigrade;
  (b) cooling the InP substrate and the n-doped InGaAsP melt material to approximately 595 degrees Centigrade;
  (c) bringing the first surface into contact with the n-doped InGaAsP melt material at approximately 595 degrees Centigrade, an InGaAsP guiding epilayer being thereby created on the first surface;
  (d) terminating formation of the InGaAsP guiding epilayer at a selected thickness by moving the InP substrate out of contact with the n-doped InGaAsP melt material;
  (e) maintaining a P overpressure above the InGaAsP guiding epilayer for approximately 45 minutes while raising the temperature of the InP substrate, a n-doped InGaAsP melt material and a p-doped InP melt material to approximately 645 degrees Centigrade;
  (f) cooling the InP substrate, the n-doped InGaAsP melt material and the p-doped InP melt material to approximately 628 degrees Centigrade,
  (g) bringing the InGaAsP guiding epilayer into contact with the n-dope InGaAsP melt material at approximately 628 degrees Centigrade, a InGaAsP active epilayer being thereby created over the InGaAsP guiding epilayer on the first surface;
  (h) terminating formation of the InGaAsP active epilayer at a selected thickness by moving the InGaAsP guiding epilayer out of contact with the n-doped InGaAsP melt material;
  (i) bringing the InGaAsP active epilayer immediately into contact with the p-doped InP melt material, an InP confining epilayer being thereby created over the InGaAsP active epilayer; and,
  (j) terminating formation of the InP confining epilayer at a selected thickness by moving the InGaAsP active epilayer out of contact with the p-doped InP melt material.

8. A liquid phase epitaxy process as in claim 7, wherein the temperature of a n-doped InGaAs melt material is also raised to approximately 645 degrees Centigrade while the P overpressure is maintained above the InGaAsP guiding epilayer, and wherein the process comprises the further steps, immediately after the step of terminating formation of the InP confining epilayer, of:
  (a) bringing the InP confining epilayer into contact with the n-dope InGaAs melt material, an InGaAs capping epilayer being thereby created over the InP confining epilayer; and,
  (b) terminating formation of the InGaAs capping epilayer at a selected thickness by moving the InP confining epilayer out of contact with the n-dope InGaAs melt material.

9. A liquid phase epitaxy process as in claim 7 or 8, wherein the stop of cooling the InP substrate and the n-doped InGaAsP melt material comprises the steps of:
  (a) rapidly cooling the InP substrate and the n-doped InGaAsP melt material to a temperature of approximately 605 degrees Centigrade; and,
  (b) cooling the InP substrate and the n-doped InGaAsP melt material at a rate of approximately 0.12 degrees Centigrade per minute to a temperature of approximately 595 degrees Centigrade.

10. A liquid phase epitaxy process as in cliam 7, wherein the step of cooling the InP substrate, the n-doped InGaAsP melt material and the p-doped InP melt material comprises the steps of:
  (a) rapidly cooling the InP substrate, the n-doped InGaAsP melt material and the p-doped InP melt material to a temperature of approximately 635 degrees Centigrade; and,
  (b) cooling the InP substrate, the n-doped GaInAsP melt material and the p-doped InP melt material at a rate of approximately 0.12 degrees Centigrade per minute to a temperature of approximately 628 degrees Centigrade.

11. A liquid phase epitacy process as in claim 8, wherein the step of cooling the InP substrate, the n-doped InGaAsP melt material, the p-doped InP melt material and the n-dope InGaAs melt material comprises the steps of:
  (a) rapidly cooling the InP substrate, the n-doped InGaAsP melt material, the p-dope InP melt material and the InGaAs melt material to a temperature of approximately 635 degrees centigrade; and,
  (b) cooling the InP substrate, the n-doped InGaAsP melt material, the p-doped InP melt material and the InGaAs melt material at a rate of approximately 0.12 degrees Centigrade per minute to a temperature of approximately 628 degrees Centigrade.

12. A liquid phase epitaxy process for growing epilayers over gratings on a first surface of an InP substrate, the substrate and epilayers together forming an InGaAsP/InP distributed feedback laser wafer, the process comprising the steps of:
  (a) maintaining an As overpressure above the first surface for approximately one hour while raising the temperature of the substrate and a n-doped InGaAsP melt material to approximately 615 degrees Centigrade;
  (b) rapidly cooling the InP substrate and the n-doped InGaAsP melt material to a temperature of approximately 605 degrees Centigrade;
  (c) cooling the InP substrate and the n-doped InGaAsP melt material at a rate of approximately 0.12 degrees Centigrade per minute to a temperature of approximately 595 degrees Centigrade;
  (d) bringing the first surface into contact with the n-doped InGaAsP melt material at a temperature of approximately 595 degrees Centigrade, a InGaAsP guiding epilayer thereby being formed on the first surface;
  (e) moving the InP substrate such that formation of the InGaAsP guiding epilayer is terminated at a selected thickness;
  (f) imagining P overpressure above the InGaAsP guiding epilayer for approximately 45 minutes while raising the temperature of the InP substrate, a n-doped InGaAsP melt material, a p-doped InP melt material and a n-doped InGaAs melt material to approximately 645 degrees Centigrade;
  (g) rapidly cooling the InP substrate, the n-doped InGaAsP melt material, the n-doped InP material and the n-doped InGaAs melt material to a temperature of approximately 635 degrees Centigrade;
  (h) cooling the InP substrate, the n-doped InGaAsP melt material, the p-doped InP melt material and the n-doped InGaAs melt material at a rate of approximately 0.12 degrees Centigrade per minute to a temperature of approximately 628 degrees Centigrade;

(i) bringing the InGaAsP guiding epilayer into contact with the n-doped InGaAsP melt material at a temperature of approximately 628 degrees Centigrade a InGaAsP active epilayer thereby being formed over the InGaAsP guiding epilayer;

(j) moving the InP substrate such that formation of the InGaAsP active epilayer is terminated at a selected thickness;

(k) bringing the InGaAsP active epilayer into contact with the p-doped InP melt material, an InP confining epilayer thereby being formed over the InGaAsP active epilayer;

(l) moving the InP substrate such that formation of the InP confining epilayer is terminated at a selected thickness;

(m) bringing the InP confining epilayer into contact with the n-doped InGaAs melt material, an InGaAs capping layer thereby being formed over the InP confining epilayer; and, (n) moving the InP substrate such that formation of the InGaAs capping epilayer is terminated at a selected thickness.

* * * * *